United States Patent [19]

Tsubomura et al.

[11] Patent Number: 5,100,519

[45] Date of Patent: Mar. 31, 1992

[54] METHOD OF TRAPPING ION IN SILICON OXIDE FILM OR SILICON OXY-NITRIDE FILM

[75] Inventors: Hiroshi Tsubomura, Minoo; Hikaru Kobayashi, Kyoto, both of Japan

[73] Assignee: Mitsubishi Kenki Kabushiki Kaisha, Japan

[21] Appl. No.: 622,531

[22] Filed: Dec. 5, 1990

[30] Foreign Application Priority Data

Dec. 7, 1989 [JP] Japan .................................. 1-318533

[51] Int. Cl.⁵ ............................................ C25D 11/32
[52] U.S. Cl. ...................................................... 205/234
[58] Field of Search ......................................... 204/58.5

[56] References Cited

U.S. PATENT DOCUMENTS 3,345,275  10/1967  Schmidt ............................. 204/58.5

*Primary Examiner*—T. M. Tufariello
*Attorney, Agent, or Firm*—Leydig, Voit & Mayer

[57] ABSTRACT

In a method of trapping ions in a silicon oxide film or a silicon oxy-nitride film, silicon or silicon nitride as an electrode is first immersed in a nonaqueous solvent containing an electrolyte. Then, a voltage is applied between the electrode and a counter electrode so as to oxidize the surface of the silicon or silicon nitride to form a silicon oxide film or a silicon oxy-nitride film. At the same time, the ions contained in the electrolyte are caused to permeate into the silicon oxide film or the silicon oxy-nitride film and trapped therein. The method is thus capable of trapping ions in a silicon oxide film or a silicon oxy-nitride film for a short time without using any evaporation apparatus and of shifting the flat band potential of the silicon.

14 Claims, 3 Drawing Sheets

METHOD OF TRAPPING ION IN SILICON OXIDE FILM OR SILICON OXY-NITRIDE FILM

BACKGROUND OF THE INVENTION

The present invention relates to an electrochemical method of trapping ions in a silicon oxide film or a silicon oxy-nitride film, which is used for producing solar cells and integrated circuits.

Conventional methods of trapping ions in oxide films or nitride films include electron beam evaporation methods (see to, for example, J. Chem. Soc Chem Commun., 1983, 1407–1408 and J Electrochem. Soc., 134 (1987), 72–76), resistance heating evaporation method, sputtering evaporation methods, and the like.

However, the above-described conventional methods have problems, ie that, since ions are trapped by evaporation, a large evaporation apparatus is required and several hours are required for sample change, evacuation and evaporation

SUMMARY OF THE INVENTION

The present invention has been achieved with a view to solving the problem of the conventional methods. Accordingly, it is an object of the present invention to provide an electrochemical method which uses no evaporation apparatus and which is capable of trapping ions in a silicon oxide film or a silicon oxy-nitride film for a short time.

To this end, the present invention provides a method of trapping ions in a silicon oxide film or a silicon oxynitride film comprising the steps of immersing a silicon or silicon nitride electrode in a nonaqueous solvent containing an electrolyte. A voltage is applied between the electrode and a counter electrode so as to oxidize the surface of the silicon or the silicon nitride to form a silicon oxide film or a silicon oxy-nitride film. Thus, the ions contained in the electrolyte permeate into the silicon oxide film or the silicon oxy-nitride film.

DESCRIPTION OF PREFERRED EMBODIMENTS

A method of trapping ions in a silicon oxide film is described below.

Various types of silicon crystals, which are used as semiconductor materials, can be used as an electrode in the present invention.

The electrolyte used in the present invention preferably contains cations having a small radius such as lithium ions, sodium ions and the like. The electrolyte is selected in accordance with the kind of ions to be trapped. Examples of such electrolytes include lithium perchlorate, sodium perchlorate, sodium chloride and the like.

Examples of nonaqueous solvents for use in the invention include acetonitrile, methanol, acetone and the like.

The concentration of the electrolyte in the solution is preferably at least 0.1 molor, more preferably, at least 1 molar, from the viewpoint of ionic conductivity.

In the method of the present invention, the silicon electrode is immersed in the solution, and a voltage is applied between the silicon electrode and a counter electrode so as to form a silicon oxide film having a thickness of about 10 to 20 Å on the silicon electrode and trap ions in the silicon oxide film.

Although the method of applying a voltage is not limited, a satisfactory method is scanning the voltage of the silicon electrode by using a potentiostat, in which a saturated calomel electrode is used as a reference for the purpose of keeping the voltage of the silicon electrode constant. Also, a method of applying a voltage by using a general constant voltage source and the like is satisfactory.

When a potentiostat is used, the voltage applied is preferably $-1$ V to $+1$ V relative to the saturated calomel electrode. The application of a voltage of over 3 V starts the decomposition of the solvents, and the application of a voltage of over 10 V creates the danger of dielectrical decomposition of the semiconductor.

A method of trapping ions in a silicon oxy-nitride film is described below.

An example of the silicon nitride used as an electrode in the present invention is a silicon nitride film having a thickness of about 10 to 20 Å formed on the surface of silicon, as described above.

A voltage is applied to the silicon nitride electrode by the same method that employed in the case of the silicon electrode so that ions are trapped in the silicon oxynitride film.

The conditions for application of a voltage may be the same as those for trapping ions in the silicon oxide film.

Figure 1:
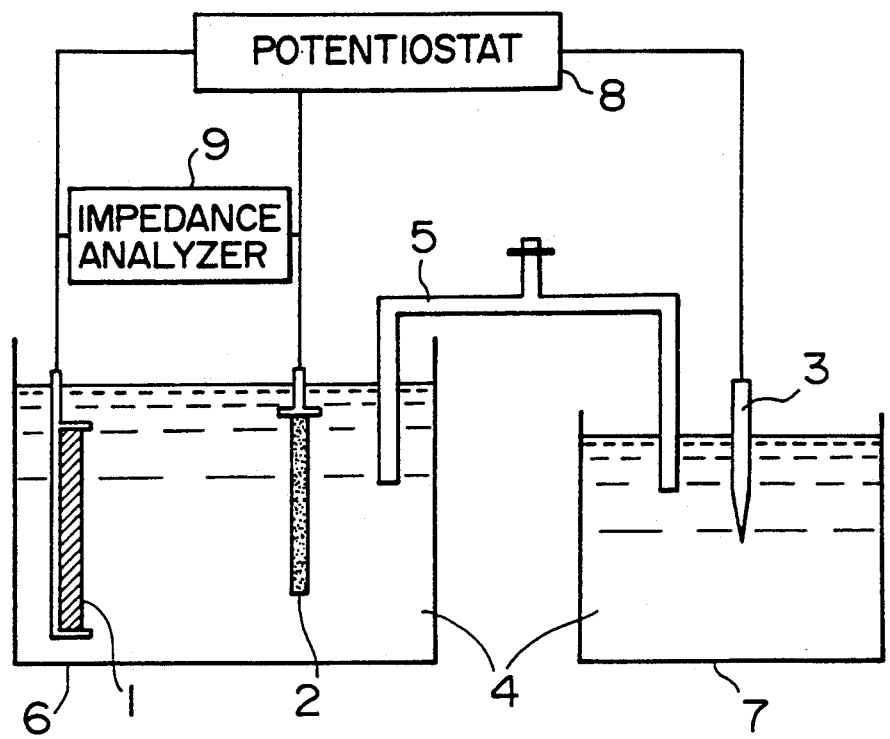
FIG. 1 is a schematic diagram of an apparatus for trapping ions in a silicon oxide film.

An example of the present invention is described below with reference to FIG. 1 FIG. 1 is an explanatory view of an apparatus for trapping ions in a silicon oxide film or silicon oxy-nitride film.

EXAMPLE 1

A silicon electrode 1 composed of a p-type Si(111) crystal which is etched with 1% diluted hydrofluoric acid, a platinum plate 2 and a saturated calomel electrode 3 were used as a working electrode, a counter electrode and a reference electrode, .respectively. A 1M solution of lithium perchlorate ($LiClO_4$), which was used as an electrolyte, was prepared by using acetonitrile as a nonaqueous solvent. In order to dehydrate the solution a small quantity of molecular sieve (3A, 1/16, manufactured by Ishizu Seiyaku Ltd.) is added.

As shown in FIG. 1, the silicon electrode 1 and the counter electrode 2 were immersed in a 1M acetonitrile solution 4 of lithium perchlorate in a cell 6. The saturated calomel electrode 3 was immersed in a 1M acetonitrile solution of lithium perchlorate in a cell 7. The cells 6 and 7 were connected by using a liquid junction 5.

The potential of the silicon electrode 1 was scanned by using a potentiostat 8 under the conditions of a potential scanning range of $-1.0$ to $+1.0$ V relative to the saturated calomel electrode and a potential scanning speed of 8 mV/second.

During this scanning, in order to confirm that the ions were trapped, a flat band potential shift was observed by capacity-potential measurement using an impedance analyzer 9. The flat band potential shift produced when the potential of the silicon electrode was scanned was plotted. The results are shown in FIG. 2.

Figure 2:
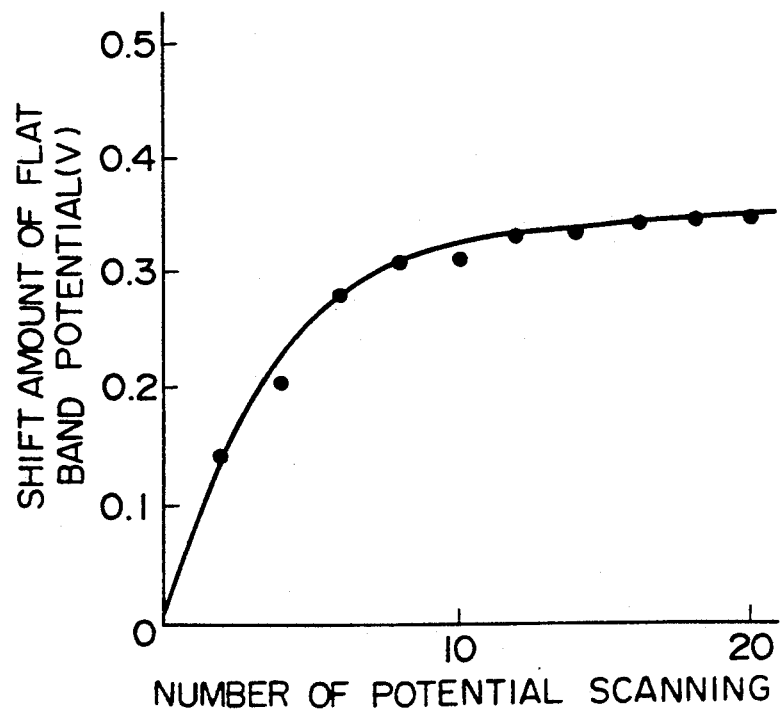
FIG. 2 is a graph showing the shift of a flat band voltage produced in Example 1 of the present invention.
Figure 3A:
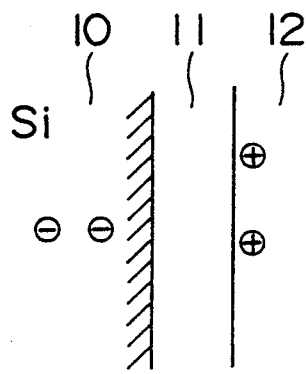
FIGS. 3A and 3B and FIGS. 4A and 4B are schematic diagrams showing the shift of a flat band voltage produced by trapped ions.

It can be seen from FIG. 2 that the flat band potential shifts toward the positive side during electrode potential scanning. The flat band potential shift is caused by trapping lithium ions in the silicon oxide film formed by reaction between the silicon electrode and a small amount of water present in acetonitrile when a voltage is applied to the silicon electrode.

Figure 4A:
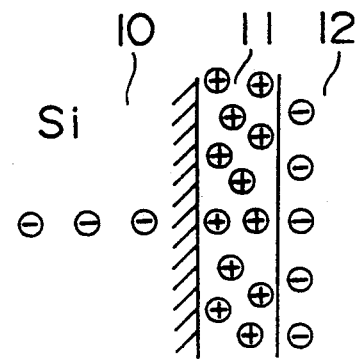
Figure 3B:
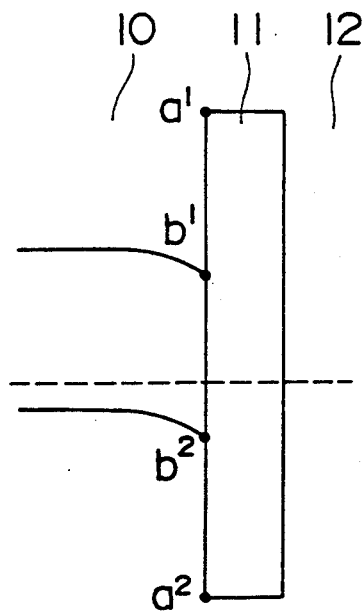
Figure 4B:
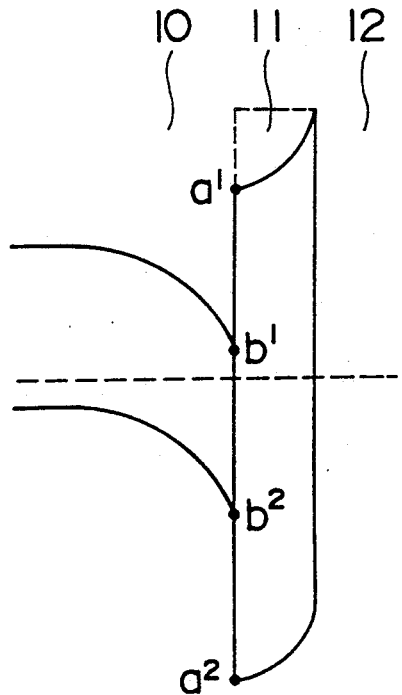

The flat band potential shift produced by trapping ions is described with reference to FIGS. 3A and 3B and 4A and 4B. When no ions are present no charge is developed in the silicon oxide film or the silicon oxy-nitride film immersed in the electrolitic solution (FIG. 3A) accordingly. Substantially no potential gradient is produced in the film, as shown in FIG. 3B corresponding to FIG. 3A. However, when ions are present in the film (FIG. 4A), a potential gradient is produced, as shown in FIG. 4B corresponding to FIG. 4A. In the drawings, reference numerals 10, 11 and 12 denote the Si, silicon oxide film and the solution, respectively When the electrode is immersed in the electrolytic solution, because counter ions are present in the vicinity of the surface of oxide film or the oxy-nitride film, a Helmholtz layer is formed. When a metal is present on the oxide film or the oxy-nitride film, charge with a sign opposite to that of the ions present in the film, is induced at the boundary between the oxide film or the oxy-nitride film and the metal. Since the difference between the band edge energy of the oxide film or the oxy-nitride film (shown by $a^1$ and $a^2$ in the drawings) and band edge energy of silicon (shown by $b^1$ and $b^2$ in the drawings) is constant, if a potential gradient is produced in the oxide film or the oxy-nitride film, the band edge energy of silicon changes, and the flat band potential is thus shifted. When the ions present in the oxide film or the oxy-nitride film are cations, as shown in FIG. 4A, the band edge of the silicon shift toward a positive potential. When p-type Si is used, therefore, the height of the barrier increases.

Figure 5:
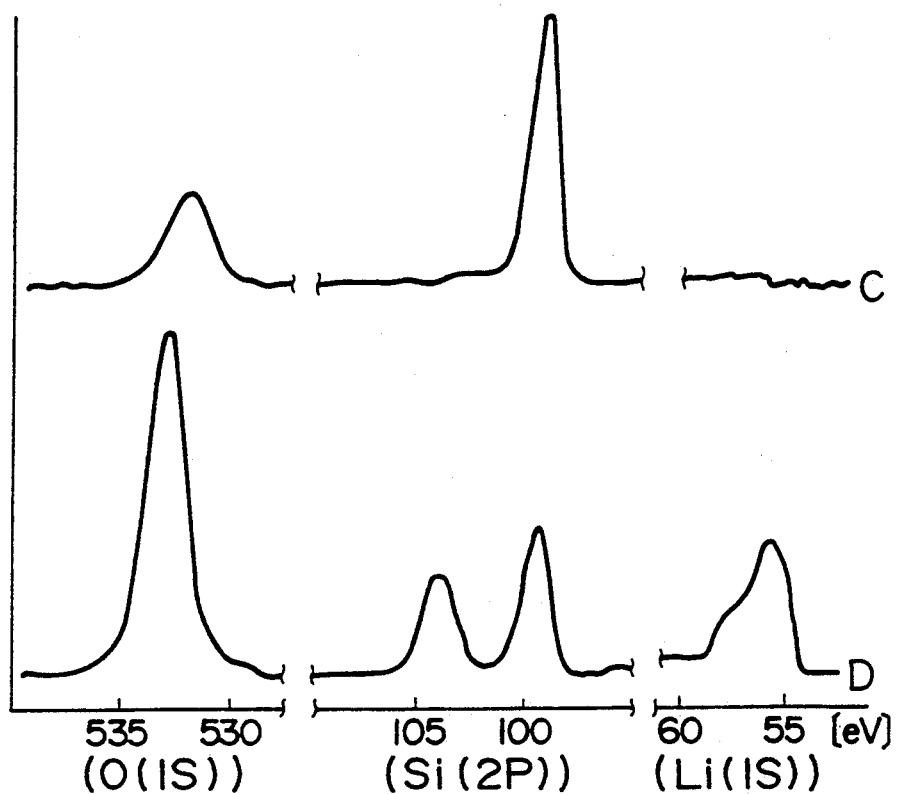
FIG. 5 is a graph showing the X-ray photoelectron spectra before and after the shift of a flat band voltage produced in Example 1 of the present invention.

In order to confirm that ions were trapped in the silicon oxide film, the X-ray electron spectra were examined before and after the shift of the flat band potential of the electrode. The results are shown in FIG. 5. In the drawing, character C denotes the spectrum obtained after the silicon electrode etched with 1% hydrofluoric acid had been immersed in a 1M acetonitrile solution of lithium perchlorate for 1 hour, and character D denotes the spectrum obtained after the potential of the electrode had been scanned 20 times in the same solution.

The spectrum C shows a peak at 103.5 eV which is caused by the silicon oxide film and which has extremely low intensity. Therefore, substantially no silicon oxide film is present. However, the spectrum D, obtained after the flat band potential shift, reveals that the silicon oxide film is present The results of calculation showed that the resulting silicon oxide film had a thickness of 15Å. In addition, although the spectrum C reveals that no lithium ion are present, the spectrum D reveals that lithium ions are present and trapped in the silicon oxide film.

EXAMPLE 2

The electrode potential was scanned by the same method as that employed in Example 1 except that a p-Si(111) electrode with a silicon nitride film formed thereon and having a thickness of 20Å was used as a working electrode. The flat band potential shift produced during scanning was plotted. The results are shown in FIG. 6.

Figure 6:
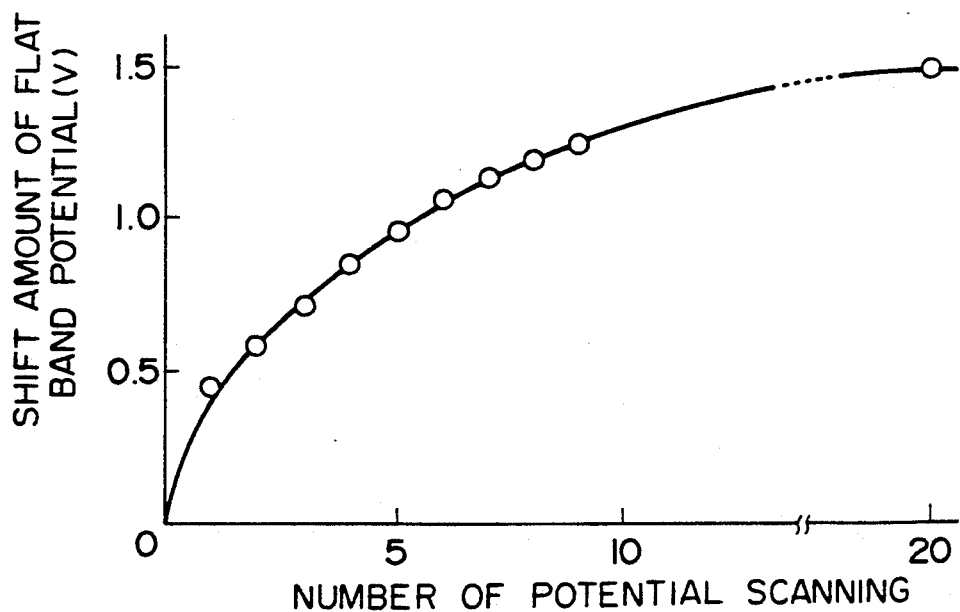
FIG. 6 is a graph showing the shift of a flat band voltage produced in Example 2 of the present invention.

FIG. 6 shows that the flat band potential of the silicon electrode having the silicon nitride film of 20Å shifts toward the positive side by potential scanning. The shift of the flat band potential is caused by trapping of lithium ions in the silicon oxy-nitride film formed when a voltage was applied to the silicon electrode with the silicon nitride film.

Although acetonitrile was used as a nonaqueous solvent in both Examples 1 and 2, the use of methanol or acetone produced the same effects. When sodium perchlorate or sodium chloride was used as an electrolyte in place of lithium perchlorate, the same results were obtained.

As described above, the present invention is capable of trapping ions in a silicon oxide film or a silicon oxynitride film for a short time without using any evaporation apparatus and of shifting the flat band potential of silicon.

What is claimed is:

1. A method of trapping ions in a silicon oxide film or a silicon oxy-nitride film comprising the steps of:
   immersing an electrode composed of a material selected from the group consisting of silicon and silicon nitride in a nonaqueous solvent containing at least 0.1 molar concentration of an electrolyte selected from the group consisting of lithium perchlorate, sodium perchlorate and sodium chloride; and
   applying a voltage between said electrode and a counter electrode so as to oxidize the surface of the electrode to form an oxide film, and causing ions contained in said electrolyte to permeate into said film.

2. A method according to claim 1 wherein said nonaqueous solvent is one selected from the group consisting of acetonitrile, methanol and acetone.

3. A method according to claim 1 wherein a voltage is applied by using a potentiostat.

4. A method according to claim 1 wherein a voltage is applied by using a constant-voltage source.

5. A method according to claim 1 wherein the voltage applied to said electrode is within the range of $-1$ V to $+1$ V verses a saturated colonel electrode.

6. A method of trapping ions in a silicon oxide film or a silicon oxy-nitride film comprising the steps of:
   immersing an electrode composed of a material selected from the group consisting of silicon and silicon nitride in a nonaqueous solvent containing an electrolyte selected from the group consisting of lithium perchlorate, sodium perchlorate and sodium chloride; and
   applying a voltage between said electrode and a counter electrode so as to oxidize the surface of the electrode to form an oxide film, and causing ions contained in said electrolyte to permeate into said film.

7. A method of trapping ions in a silicon oxide film or a silicon oxy-nitride film comprising the steps of:

immersing an electrode composed of a material selected from the group consisting of silicon and silicon nitride in a nonaqueous solvent containing an electrolyte wherein the concentration of said electrolyte is at least 0.1 molar; and applying a voltage between said electrode and a counter electrode so as to oxidize the surface of the electrode to form an oxide film, and causing ions contained in said electrolyte to permeate into said film.

8. A method of trapping ions in a silicon oxide film or a silicon oxy-nitride film comprising the steps of:

immersing an electrode composed of a material selected from the group consisting of silicon and silicon nitride in a nonaqueous solvent containing an electrolyte wherein said solvent is selected from the group consisting of acetonitrile, methanol and acetone; and applying a voltage between said electrode and a counter electrode so as to oxidize the surface of the electrode to form an oxide film, and causing ions contained in said electrolyte to permeate into said film.

9. A method of trapping ions in a silicon oxide film or a silicon oxy-nitride film comprising the steps of:

immersing an electrode composed of a material selected from the group consisting of silicon and silicon nitride in a nonaqueous solvent containing an electrolyte wherein said electrolyte is at least 0.1 molar and selected from the group consisting of lithium perchlorate, sodium perchlorate and sodium chloride, said solvent is selected from the group consisting of acetonitrile, methanol and acetone; and applying a voltage between said electrode and a counter electrode so as to oxidize the surface of the electrode to form an oxide film, and causing ions contained in said electrolyte to permeate into said film.

10. A method according to claim 6 wherein the thickness of the oxide film is between about 10 and 20 angstroms.

11. A method according to claim 7 wherein the thickness of the oxide film is between about 10 and 20 angstroms.

12. A method according to claim 8 wherein the thickness of the oxide film is between about 10 and 20 angstroms.

13. A method according to claim 9 wherein the thickness of the oxide film is between about 10 and 20 angstroms.

14. A method according to claim 13 wherein the applied voltage is less than 10 V.

* * * * *